(12) United States Patent
Nickel et al.

(10) Patent No.: US 8,478,549 B2
(45) Date of Patent: Jul. 2, 2013

(54) WELD CHECK STATIONS

(75) Inventors: Joshua G. Nickel, San Jose, CA (US);
Ruben Caballero, San Jose, CA (US);
Jason Flickinger, Santa Clara, CA (US);
Scott A. Myers, San Francisco, CA (US); Mattia Pascolini, Campbell, CA (US); Robert W. Schlub, Cupertino, CA (US); Trent Weber, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 472 days.

(21) Appl. No.: 12/869,617

(22) Filed: Aug. 26, 2010

(65) Prior Publication Data

US 2011/0282593 A1    Nov. 17, 2011

Related U.S. Application Data

(60) Provisional application No. 61/334,682, filed on May 14, 2010.

(51) Int. Cl.
*G01B 5/28* (2006.01)
*G01R 31/00* (2006.01)

(52) U.S. Cl.
USPC .............. 702/39; 702/118; 702/121; 702/189

(58) Field of Classification Search
USPC ................................ 702/39, 57–59, 118–126
See application file for complete search history.

(56) References Cited

U.S. PATENT DOCUMENTS

| 5,656,933 | A | * | 8/1997 | Frederickson et al. | ....... 324/693 |
| 2006/0071680 | A1 | | 4/2006 | Behziz et al. | |
| 2009/0058425 | A1 | | 3/2009 | Bartley et al. | |
| 2010/0250158 | A1 | * | 9/2010 | McElfresh et al. | ............ 702/58 |

OTHER PUBLICATIONS

Kwon et al. (hereinafter "Kwon"), "Detection of Solder Joint Degradation using RF Impedance Analysis," Components, Packaging, and Manufacturing Technology, Part B: Advanced Packaging, May 1996.*
Barber et al., "A Bare-chip Probe for High I/O, High Speed Testing", Hewlett-Packard Company, Mar. 1994.
"Sonic Sensors Emat Ultrasonics Inc.," http://www.sonicsensors.com/industrial/index.html; Jul. 22, 2010.
"Method for Measuring Interconnect Parasitics," Oct. 13, 2006, IPCOM000141790D.
Kwon et al., "Detection of Solder Joint Degradation Using RF Impedance Analysis," Components, Packaging, and Manufacturing Technology, Part B: Advanced Packaging, May 1996.
Tsai et al., "An experimental technique for full package inductance matrix characterization," Components, Packaging, and Manufacturing Technology, Part B: Advanced Packaging, May 1996.

* cited by examiner

*Primary Examiner* — Phuong Huynh
(74) *Attorney, Agent, or Firm* — Womble Carlyle Sandridge & Rice LLP

(57) ABSTRACT

A method of manufacture for a portable computing device is described. In particular, methods and apparatus for assessing a quality of weld joints used to connect one or more components of the portable computing device are described. The weld joints can include one or more weld points. At a weld check station, using a vector network analyzer, a test signal generated can be passed through the weld joint and a response signal can be measured. The measured characteristics can be used to assess a quality of the weld joint. In one embodiment, the vector network analyzer can be used to generate a number of high frequency test signals that are passed through the weld to perform a time domain reflectometry measurement where the weld joint can be accepted or rejected based upon the measurement.

25 Claims, 12 Drawing Sheets

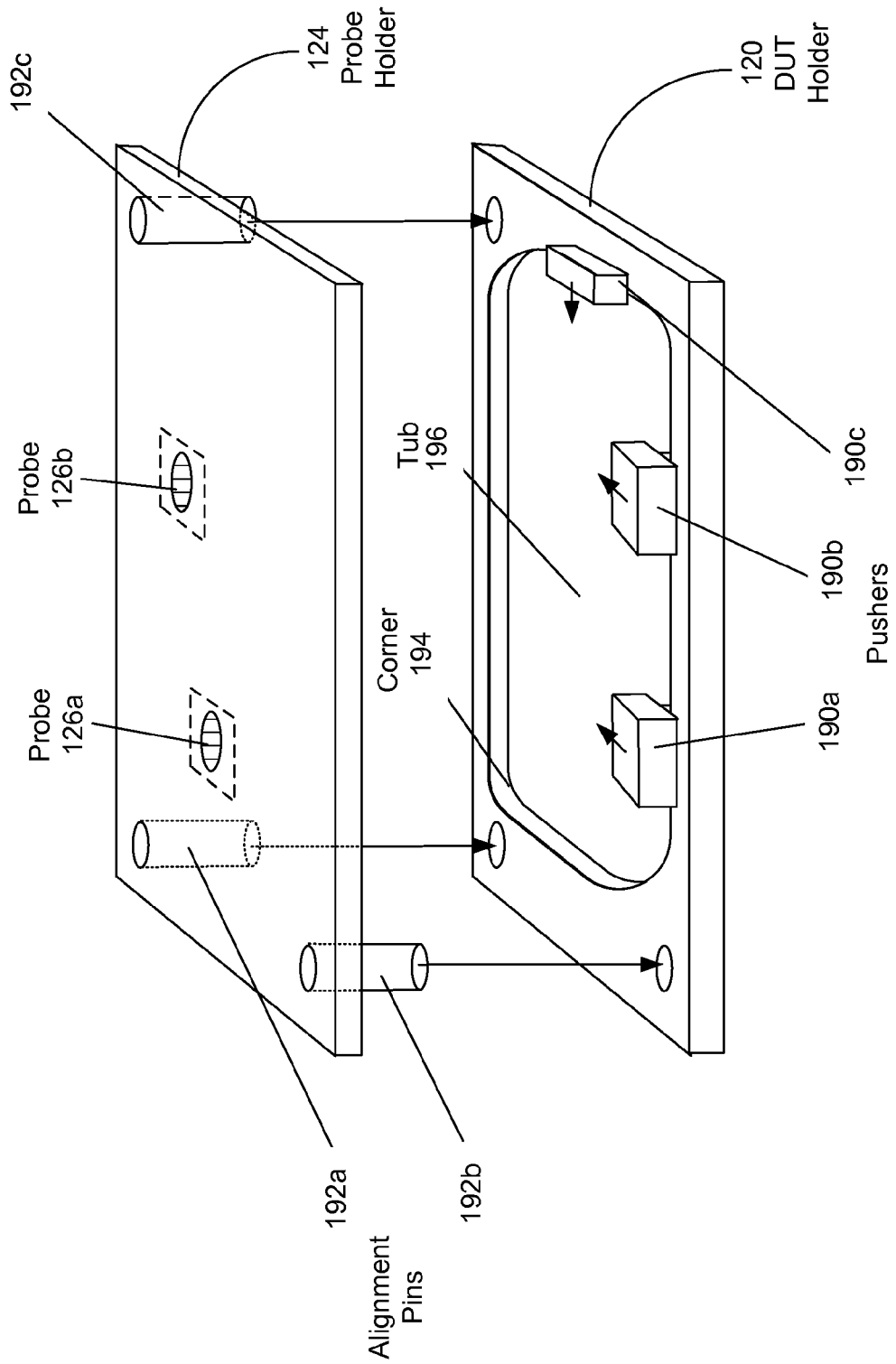

WELD CHECK STATIONS

CROSS REFERENCE TO RELATED APPLICATIONS

This patent application claims priority under 35 U.S.C. §119(e) to U.S. Provisional Patent Application Ser. No. 61/334,682 entitled "Weld Check Stations" by Nickel, filed May 14, 2010 which is incorporated by reference in its entirety for all purposes.

BACKGROUND OF THE INVENTION

1. Field of the Invention

The described embodiments relate generally to non-destructive testing for portable computing devices. More particularly, the present embodiments relate to assessing the quality of a weld joint in a portable computing devices using time domain reflectometry.

2. Description of the Related Art

A design of a portable computing device can involve complex tradeoffs. A few factors that can be considered in the design process are cosmetic appeal, weight, manufacturability including quality control, durability, thermal compatibility and power consumption. A component that is selected on the basis of its positive contribution to one of these design factors can have an adverse impact on one of more other design factors.

During manufacture of a portable device one or more components can be welded together. For instance, during assembly of an antenna system, one or more components of the antenna system can be welded together. After two parts are welded together, for the purposes of quality control, it can be desirable to assess whether the weld was successful and whether the weld meets some quality criteria. A weld assessment can be desirable because an unsuccessful weld or a poor quality weld can result in failure of a component or affect the performance of its associated system during operation of the device.

In the past, weld joints have been tested using methods such as visual inspections and a mechanical stress testing. Using visual inspection, it can be possible to determine whether two parts are joined by a weld. Nevertheless, because the components of a portable computing device can be tightly packed or a welded component can be sealed within a casing or surround by a material, portions of the weld may simply not be visible or easily seen. Therefore, it can be difficult to visually assess the quality of the weld.

Mechanical testing can be used to assess a quality of a weld. For example, a mechanical stress can be applied to two welded components where a magnitude of the mechanical stress is selected such that a poor quality weld will break under the mechanical stress while a weld of sufficient quality will not break under the applied mechanical stress. A break during stress testing indicates some problem with the weld. For instance, the weld may have not been implemented over a sufficient area during the welding process.

A disadvantage of mechanical testing is that it can be time consuming. Another disadvantage is that applying a sufficient mechanical stress can risk damage to other device components. Thus, in a mass production environment, mechanical testing of a weld may not be practical. Therefore, it would be beneficial to provide method and apparatus for weld quality assessment that are fast, non-damaging and applicable in a mass production environment suitable for manufacturing a portable computing device.

SUMMARY OF THE DESCRIBED EMBODIMENTS

This paper describes various embodiments that relate to systems, methods, and apparatus for assembling portable computing devices. The portable computing device can be but is not limited to a lap top computer, a netbook computer, a smart phone, a table computer and a portable media player. Within the portable computing device, one or more weld joints each including multiple weld points can be utilized to join various components. For instance, one or more weld joints can be used to join two components in an antenna system or two components used in a housing used in the portable computing device. Embodiments described herein can relate to methods and apparatus for efficiently checking and assessing a quality of the weld joints used in the portable computing device.

In more detail, the checking methods and apparatus can involve passing a test signal generated by a vector network analyzer (VNA) through a weld joint. The test signal can be transmitted by a probe positioned proximate to the weld joint such that the test signal is transmitted from a first component joined via the weld joint to a second component. One or more receivers associated with the VNA can be used to measure characteristics of the signal reflected or transmitted through the weld joint where the measured characteristics of the reflected or transmitted signals are used to assess the quality of the weld joint.

As example, in embodiments described herein, the VNA can be used to perform time domain reflectometry (TDR) measurement or a swept frequency impedance (SFI) measurement. In a TDR measurement or a swept frequency impedance measurement, test frequencies within a frequency range, such as a couple of hundred frequencies between 100 MHz and 100 GHz, can be generated and transmitted through each weld joint. Then, using the VNA, the reflected signals can be measured and analyzed on a frequency by frequency basis. The VNA can be used to measure a magnitude as well as a phase of the reflected signals at each frequency.

To assess a quality of each weld joint using the TDR or SFI measurements generated using the VNA, a TDR or SFI analysis can first be performed on a weld joint determined to satisfy weld quality requirements. The weld joint satisfying weld quality requirement can be referred to as a "gold unit." To assess the quality of a weld joint for a device under test (DUT), a TDR or SFI analysis can be performed on the weld joint of the DUT and then the results can be compared to the TDR or SFI analysis of the weld joint for the gold unit.

The comparison of the TDR or SFI measurements between the weld joint of the DUT and the weld joint of the gold unit can be performed at a weld check station. The weld check station can include 1) a VNA, 2) a probe holder for holding one or more probes that are coupled to the VNA, 3) a DUT holder where the DUT is placed in the DUT holder during TDR or SFI measurements, 4) a memory storing TDR or SFI measurements previously performed on the gold unit, which can be generated at the weld test station and 5) comparison software for comparing the gold unit TDR measurements to TDR measurements or the gold unit SFI measurements to SFI measurements of a DUT currently being tested. The DUT holder can be configured to align the DUT with the probes and hold the DUT in place during the TDR or SFI measurement. The comparison software can be used to compare the TDR measurements of the DUT to the TDR measurements of the gold unit stored in the memory or the SFI measurements of the DUT to the SFI measurements of the gold unit stored in the memory. Based on the comparison performed by the comparison software, one or more weld joints associated with the DUT can be accepted or rejected.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which:

FIG. 8A is a perspective view of an embodiment of a probe holder including alignment pins for aligning the probe holder to a DUT holder.

DETAILED DESCRIPTION OF SELECTED EMBODIMENTS

Figure 1:
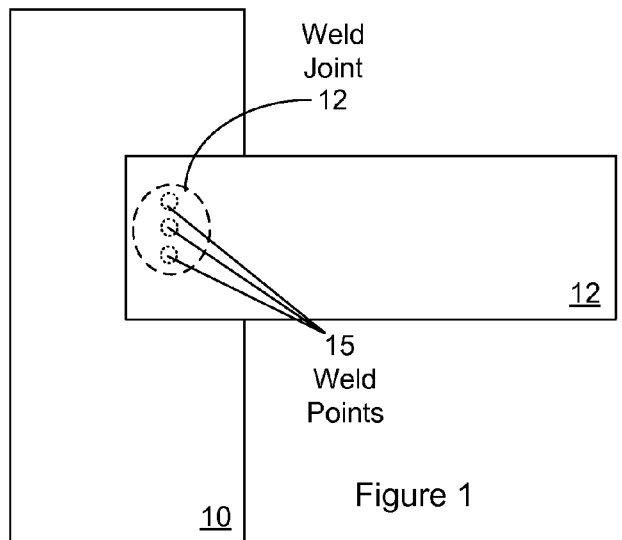
FIGS. 1 and 2 show block diagrams of weld joints between two components.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following relates to methods and apparatus for checking weld joints used in a portable computing device. Weld joints can be critical to the operation and durability of the portable computing device. Poor quality weld joints can lead to component malfunctions that significantly reduce a device's expected operational lifetime. Therefore, apparatus and methods are desirable that allow the quality of weld joints to be assessed quickly and efficiently during the manufacturing process. The apparatus and methods can also be used to test weld joints at other times, such as to test joints during research and engineering development or to test joints on defective products that have been returned.

A weld joint can connect two components of a portable computing device such as but not limited to a laptop computer, a netbook computer, a tablet computer, a smart phone, a portable media player, etc. The weld joint can provide an electrical connection, a mechanical or both between the two components. For instance, a weld joint can be used to join components of an antenna system used in the portable computing device or a components of an enclosure used in the portable computing device.

In more detail, a vector network analyzer (VNA) can be used to assess the quality of weld joint used in a portable computing device. Using the VNA, a probe positioned proximate to a weld joint location can be used to send one or more test signals through the weld joint. In response to generating the test signals, the probe can be configured to detect one or more different types of response signals. The response signals can be transmitted from the probe to receivers in the VNA so that characteristics of the response signals can be measured. The measured characteristics of the response signals can be compared to response signals previously measured from one or more similar weld joint that have been deemed to be of a satisfactory quality, such as weld joints on a gold unit. Based upon the comparison, a quality of the current weld joint being tested can be assessed (As previously described, a weld joint satisfying weld quality requirement can be referred to as a "gold unit.").

In particular embodiments, a weld check station including a VNA, a probe holder with one or more probes coupled to the VNA and a device under test (DUT) holder can provided. At the weld check station, the probes coupled to the VNA can be used to perform time domain reflectometry (TDR) or swept frequency impedance (SFI) measurements on or more weld joints of a DUT placed in the DUT holder. The DUT holder can help to align the DUT with the probes so that a proper measurement is generated. The measurements generated for the DUT can be compared to measurements previously performed on a gold unit at the weld check station. Based upon the comparison, the DUT can be accepted where additional assembly steps can occur after acceptance or the DUT can be rejected where the DUT can possibly be repaired or discarded.

Figure 4:
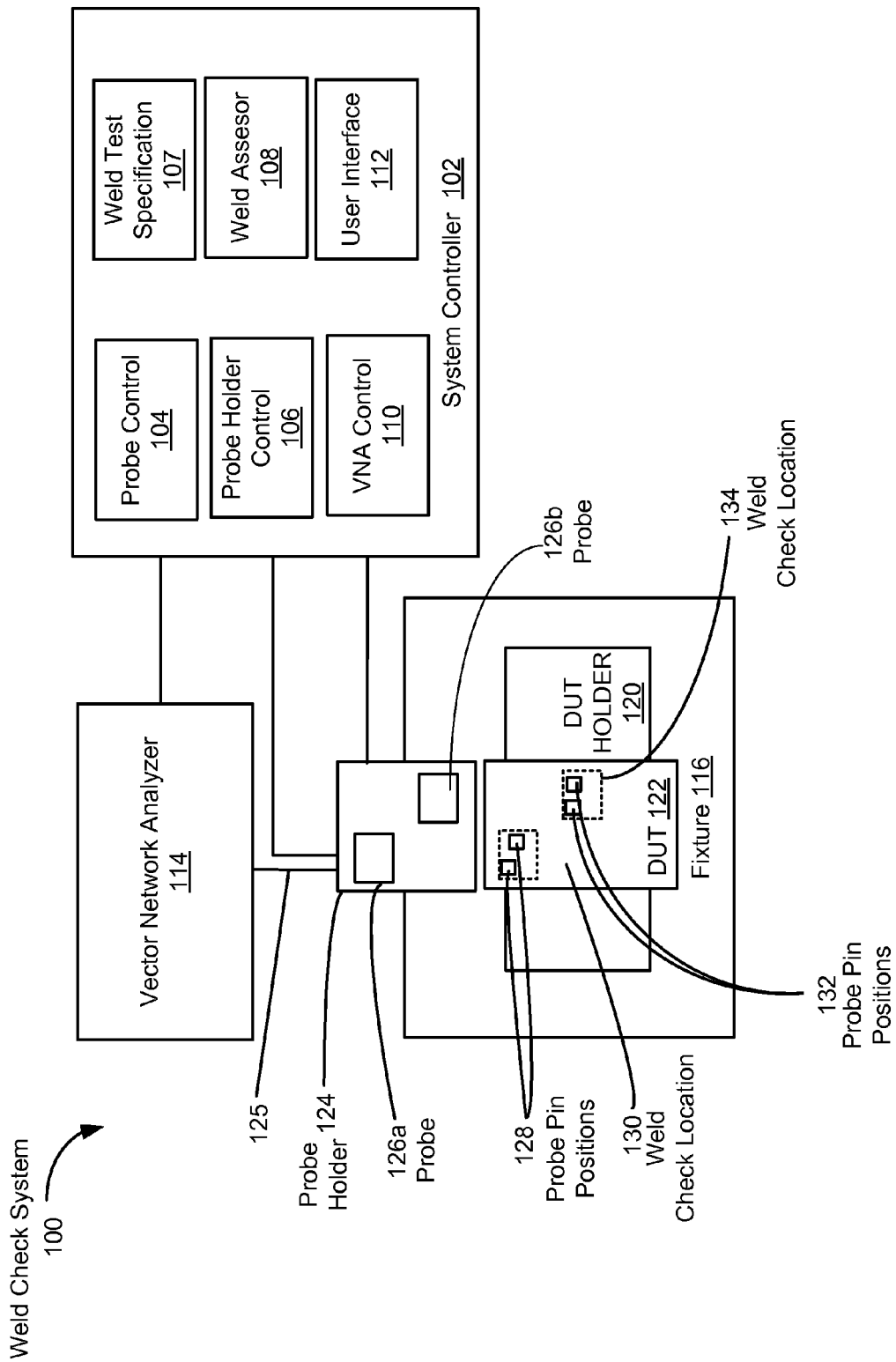
FIG. 4 shows a block diagram of an embodiment of a weld check system.
Figure 5:
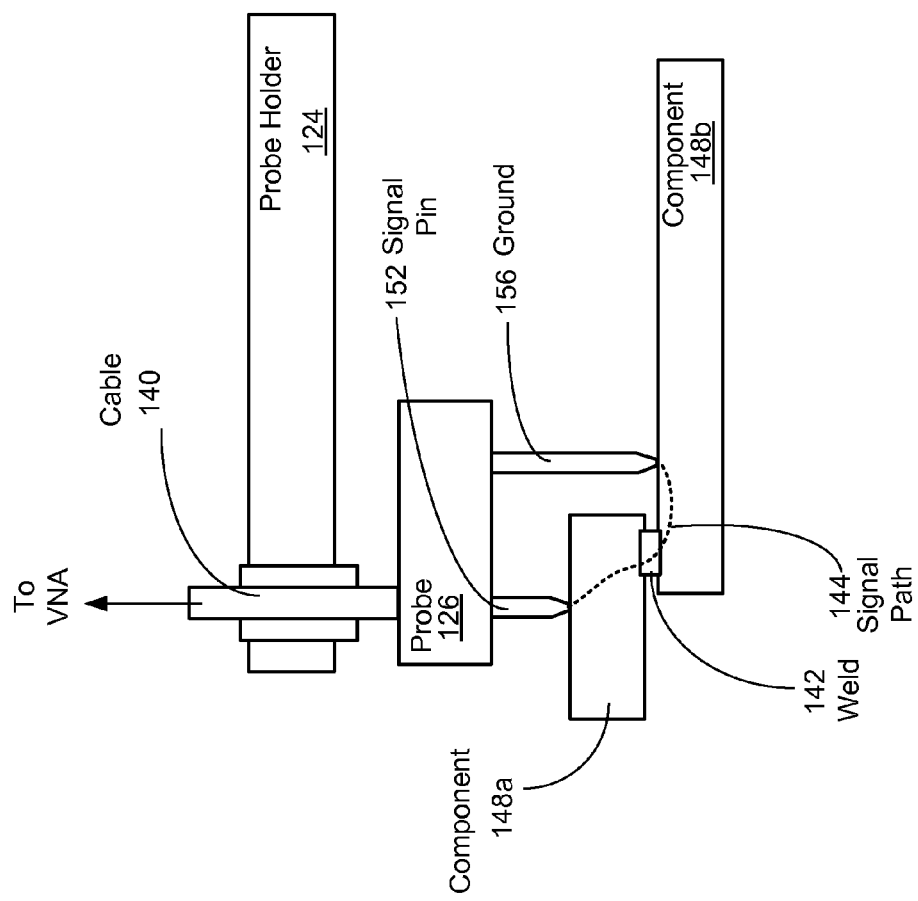
FIG. 5 shows a side view of an embodiment of a probe coupled to a vector network analyzer for assessing a quality of a weld joint.
Figure 6:
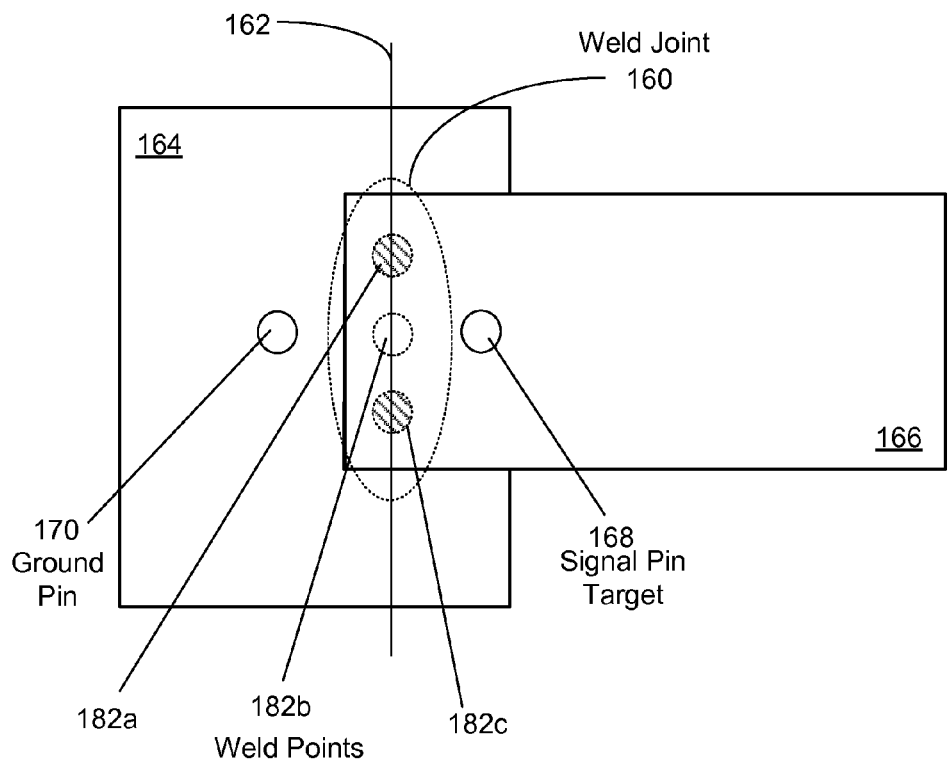
FIGS. 6 and 7 are a top view of embodiments of pin locations for a probe used to measure characteristics of a multi-point weld joint between two components.
Figure 7:
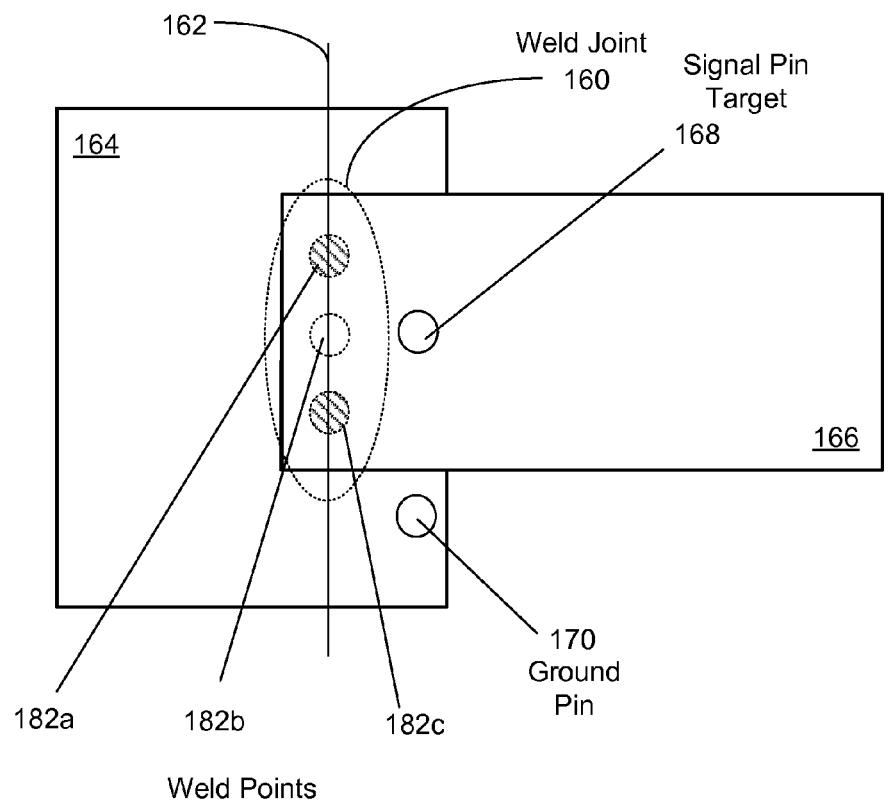
Figure 9:
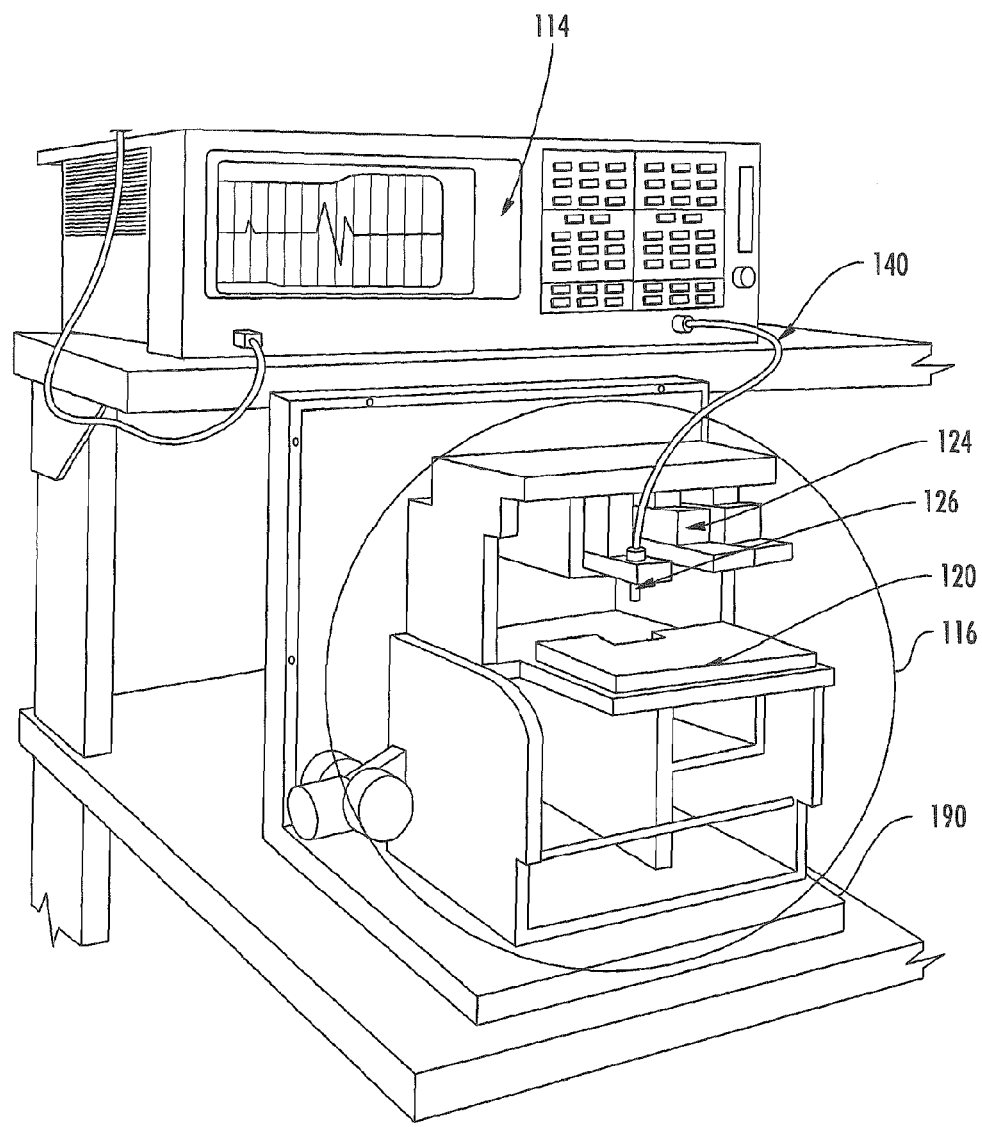
FIG. 9 is a perspective view of an embodiment of a weld check station.
Figure 10:
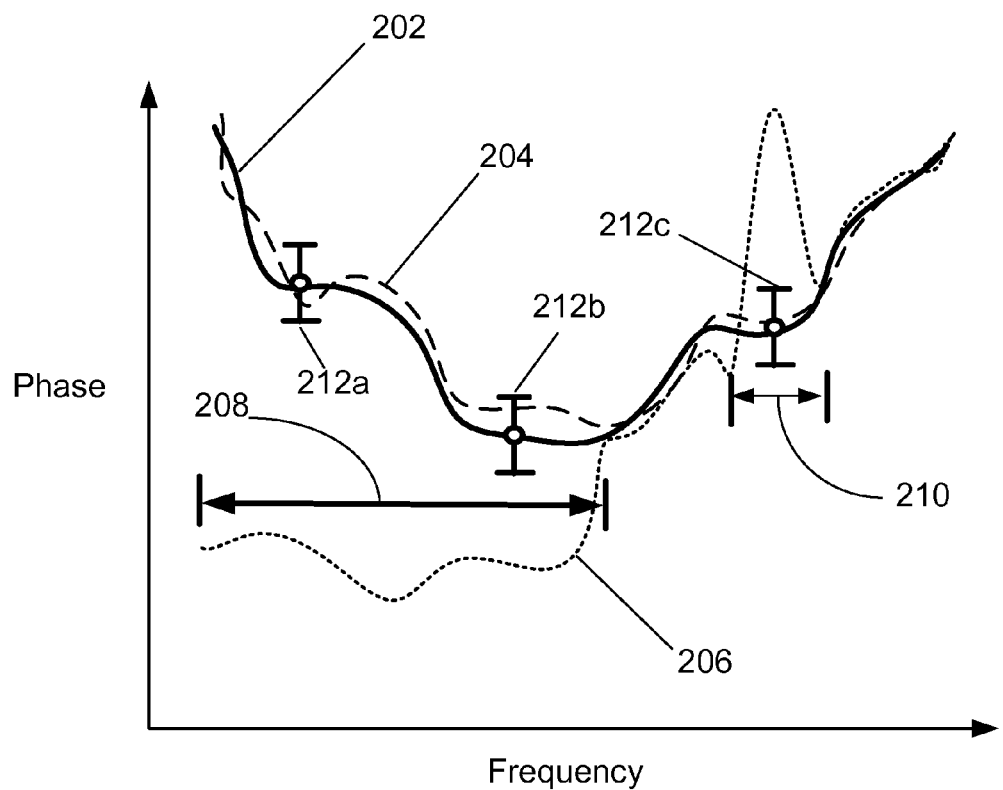
FIG. 10 is a graph of phase versus frequency for a number of time domain reflectometry measurements.

Additional details are provided with respect to the following figures. In particular, with respect to FIGS. 1-3, weld joints between two components of the portable computing device are described. In FIG. 4, an embodiment of a weld test system that can be used to check a weld between two components of a portable computing device is described. With respect to FIG. 5, a side view of an embodiment of a probe coupled to a vector network analyzer placed proximate to a weld location between two components is discussed. In FIGS. 6 and 7, embodiments of pin locations for probes used to measure characteristics of a weld joint are described. With respect to FIG. 8A-8D, fixture assemblies that are configured to hold and align a device during testing at a weld check station are described. In FIG. 9, one embodiment of a weld check station is discussed. In FIG. 10, a phase versus frequency plot from a TDR analysis is described. Finally, methods of developing pass-fail criteria for a weld check, calibrating a weld check station and utilizing a weld check station are described with respect to FIGS. 11-13.

FIG. 1 shows a block diagram of a weld joint 12 between two component parts, such as 10 and 12. A weld joint 12 can include one or more weld points, such as but not limited to three weld points 15. A welding gun can be used to generate each of the weld points. Using the welding gun, the welding points can be generated in a serial manner, such as one weld point at a time. Further, the weld gun can be configured to generate multiple weld points simultaneously.

The welding gun can be used to apply thermal energy at a particular location, i.e., a weld point. The applied thermal energy can melt a portion of each of the components, such as 10 and 12, proximate to the weld point where the weld gun is placed. When the melted portion solidifies, a weld column can be formed that joins the two components at the weld point (see FIG. 3). As is described as follows with respect to FIGS. 4-13, a quality of a weld joint can be assessed at a weld check station using a vector network analyzer.

As an example, a welding gun can be used to join two metal parts, such as two stainless steel parts. The component parts, such as 10 and 12, connected by the weld joint can be used in a particular system of a portable computing device. For instance, two welded components can be used in an antenna system. As another example, two welded components can be used as part of an enclosure for the portable computing device.

Multiple weld joints can be used to connect two components parts. For example, in FIG. 2, two component parts, 18 and 20, are shown connected by weld joints, 22, 26 and 30, at three different locations. Weld joint 22 includes three weld points. Weld joint 26 includes two weld points and weld joint 30 includes one weld point.

As will be described in more detail, time domain reflectometry (TDR), which can involve generating a number of test signals at different frequencies using the VNA, can be used to assess a quality of each weld joint. In another embodiment, a swept frequency impedance (SFI) measurement can be used to assess a quality of each weld joint. A TDR measurement and SFI measurement can both involve determining properties of a reflected response signal that is measured in response to applying a test signal. However, TDR and SFI can differ in the way the response signal is processed and displayed.

An advantage of TDR or SFI measurement over a direct current measurement to assess the quality of the weld can be that TDR or SFI can provide a more localized measurement. In a direct current measurement, a voltage is applied across the weld joint, such as 14. When a current is detected between the two components, such as 10 and 12 connected via the weld joint 14, it can be assumed the current is flowing across the electrical path provided by the weld joint and hence the weld joint is intact. Whereas when no current is detected, it can be assumed that the weld joint is not intact because the electrical path has been broken.

In general, a TDR or SFI measurement using the apparatus and methods described herein can be applied to any type of joint involving conductive components and is not limited to weld joints. For example, a conductive fastener, such as a metal screw, can be used to joint two parts. The joint involving the screw can be tested to determine if the screw is fully seated or cross threaded. In another example, a joint can involve utilization of a spring. The methods described herein can be used to determine if a spring is broken or defective in some manner. In yet another example, a joint can involve materials, such as conductive foam or a conductive tape. The methods described herein can be used to test the integrity of a joint formed from a combination of different conductive materials, such as metals, foams and/or tapes.

Figure 2:
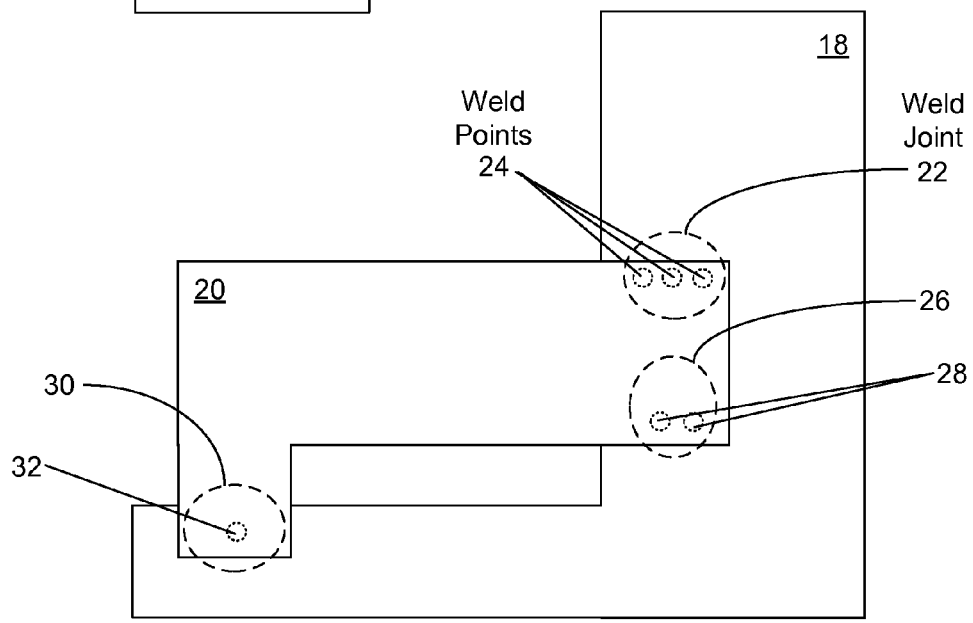

In FIG. 2, the two components 18 and 20 are connected via three weld joints, 22, 26 and 30. If two of the three weld joints have been improperly formed such that the two components 18 and 20 are not connected at two of the weld joints, an electrical path can still exist between the two components via the third weld joint. Therefore, if a direct current measurement is performed by applying a voltage across the two components, 18 and 20, the two failed weld joints may not be detected because the current can travel around the failed joints via the electrical path provided by the third weld joint that is intact. Using a TDR or SFI analysis, however, it can be possible to detect a failed weld joint between components 18 and 20 even if the other two weld joints are intact because a TDR or SFI analysis tends to be more localized than a direct current measurement. Since the TDR or SFI analysis is more localized, when multiple weld joints are used to join two components, the TDR or SFI analysis can be used to distinguish the weld quality of one weld joint independent of the weld quality of the other weld joints used to connect the two components, such as to distinguish a weld quality of weld joint 22 independent of the weld quality of joint 26 or joint 30.

Figure 3:
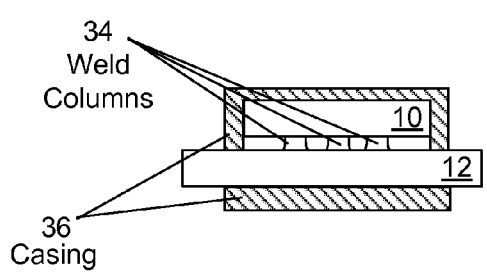
FIG. 3 shows a cross-section of a weld joint.

FIG. 3 shows a cross-section of a weld joint, such as weld joint 14 between components 10 and 12 shown in FIG. 3. The three weld points 15 form three weld columns 34. The three weld columns 34 can mechanically join components 10 and 12. Further, the three weld columns can provide an electrical path between components 10 and 12.

In a particular embodiment, a weld joint, such as 14, can be enclosed by a casing, such as 36. For instance, the two components, 10 and 12, can be surrounded by a material, such as a plastic, in the area proximate to the weld joint. Thus, it may not be possible to visibly inspect the weld joint because it is enclosed in the casing. Nevertheless, as will be discussed in more detail as follows, to assess the quality of an encased weld joint, a probe can be placed at locations away from the casing where the components are exposed (e.g., the casing may only enclose an area of the components proximate to the weld joint and the probes can be placed outside of the casing) or holes through the casing can be provided proximate to the weld joint to allow pins associated with a probe to be placed in contact with components associated with a weld joint.

FIG. 4 shows a block diagram of an embodiment of a weld check system 100. The weld check system 100 can include 1) a system controller 102, 2) a vector network analyzer (VNA) 114, 3) a probe holder 124, 4) one or more probes, such as probes 126a and 126b, coupled to the probe holder 124, for sending test signals through a weld joint and receiving response signals, 5) at least one communication connection, such as 125, that allows test and response signals to be sent between the probes and the VNA 114 and 6) a device under test (DUT) holder 122 for securing a DUT during a measurement.

In one embodiment, a multiplexer box can be placed on connection 125. A VNA can have a limited number of channels. More probes can be connected to the multiplexer box than can fit on the channels of the VNA. The multiplexer box can be used to switch the connected probes between the channels. Rather than a multiplexer box, multiple VNAs can be utilized.

The system controller 102 can include one or more processors and memory devices. The system 100 can be used to characterize one or more weld joints used in a device under test (DUT) 122, such as weld test locations 130 and 134. As previously described, the DUT 122 can be a component of a portable computing device such as but not limited to a laptop computer, a netbook computer, a tablet computer, a smart phone and a portable media player.

In particular embodiments, the DUT holder 120, the probe holder 124 and one or more probes, such as 126a and 126b, can be configured together as parts of a fixture 116. The fixture 116 can include an electrical isolation system, such as an electrical absorber (not shown). The electrical absorber can be used to absorb stray signals generated in the environment in which the fixture is placed, such as radio signals generated from other weld check stations. One embodiment of a fixture configuration including an electrical isolation system that can be used in a weld check station is described in more detail with respect to FIG. 9.

The DUT holder 120 can be used to hold the DUT 122 in place during a measurement. To make consistent and accurate measurements, it can be necessary to precisely position the one or more probes, such as 126a and 126b, relative to weld joints of the DUT 122. In particular embodiments, a probe, such as 126a or 126b, can include pins, such as two pins, where at least one pin is placed in contact with each of the two components connected via a weld joint. A probe with two pins, each pin in contact with one of the two components connected via a weld joint, is shown in FIG. 5.

In some embodiments, a DUT, such as 122, can include one or more weld joints. Thus, the weld check system 100 can be configured to perform measurements at one or more locations on a DUT, such as 122. For instance, a probe, such as 126a, can be positioned with probe pin positions 128 at a weld check location 130 and a probe, such as 126b, can be positioned with probe pin positions 132 at a weld check location 134.

The DUT holder 120 can be used to hold the DUT 122 in a precise location relative to the probes, such as 126a and 126b, so that consistent measurement can be made as different devices are tested. For instance, the DUT holder 120 can cradle or surround the DUT 122 on two or more sides. In one embodiment, the DUT holder 120 can be formed from a plastic material. In another embodiment, the DUT holder 120 can include one or more guides, alignment tracks and/or depressions for alignment pins that help to align the probe holder 124 and its associated probes, such as 126a and 126b, at a particular position relative to the DUT 122. An embodiment of a probe holder 124 with alignment pins configured to mate with a DUT holder 120 including apertures for accepting the alignment pins is described with respect to FIG. 8A.

The vector network analyzer (VNA) 114 can be used to generate test signals that are output at a probe, such as 126a and 126b, and receive response signals detected via the one or more probes. The VNA 114 can be configured to generate a test signal with a particular amplitude and phase and to measure only an amplitude of the response signal (scalar measurement) or the amplitude and the phase of the response signal (vector measurement). In particular embodiments, the VNA can be used to generate test signals at a number of different frequencies to perform a time domain reflectometry (TDR) or swept frequency impedance (SFI) analysis of the weld joint. Thus, one or more probes, such as 126a and 126b, can be TDR or SFI compatible probes. An example of a phase versus frequency plot for a TDR analysis of a weld joint is described with respect to FIG. 10.

As previously described, the probe 126 can include multiple pins. For instance, in one embodiment, the probe 126 can include a single signal pin and a single ground pin where the signal pin is placed in contact with a first component of the weld joint and the ground pin is placed in contact with the second component of the weld joint. In one embodiment, a probe can multiple ground pins. In another embodiment, the signal pin and/or the ground pin can be a pogo pin. In yet another embodiment, the probes can be a high-speed TDR probes that transform a coax cable to a signal/ground pair, or a custom-routed printed circuit board (PCB) that uses pogo pin or other compliant connectors.

In further embodiments, the probes do not have to be straight. The probes can be curved according to a custom specification to allow the probes to extend into hard to reach locations of a DUT. In addition, the probes do not have to necessarily touch a conductive surface during a measurement. For instance, a probe tip can be coated with a material, such as Teflon, to prevent the probe from scratching a cosmetic surface. In this example, a signal can be induced in the probe via capacitance. A probe designed to operate in this manner can be referred to as a capacitance probe.

The probe holder control 106 can be used to control a position of the one or more probes, such as 126a and 126b, and assess whether each of the probes is positioned correctly. For instance, a probe holder 124 including probes, such as 126a and 126b, can be positioned above a DUT 122 and DUT holder 120. The probe holder control 106 can be configured to control a position of the probe holder 124 relative to the DUT 122 and the DUT holder 120 such that probe holder 124 can be moved away or brought towards the DUT 122 and the DUT holder 120. When the probe holder 124 is brought towards the DUT 122, the probes, such as 126a and 126b, can be brought into contact with the two components connected via each weld joint and measurements can be performed to assess the weld quality of each joint. For instance, probe pins on probe 126a can be positioned at 128 and probe pins on probe 126b can be positioned at 132. When the probe holder 124 is separated from the DUT holder 120, a DUT, such as 122, currently in the DUT holder 120, can be removed and a new DUT can be placed in the holder. The, the weld checking process can be repeated on the new DUT.

In various embodiments, the probe holder 124 and the DUT holder 120 can be configured to move both horizontally and vertically relative to one another. In one embodiment, the probe holder 124 and the DUT holder 120 can be constrained to move only vertically relative to one another. For instance, the probe holder 124 can be configured to be raised and lowered from a DUT holder 120 in a fixed vertical position or the DUT holder 120 can be configured to be raised or lowered from a probe holder 124 in a fixed vertical position. In another example, the DUT holder 120 and the probe holder 124 can be configured to each be raised or moved away from a fixed vertical position where a measurement is performed when the DUT holder 120 and probe holder are brought together at the fixed vertical position.

The positional control of the probe holder 124 and/or the DUT holder 120 can also be performed manually. In a particular embodiment, the fixture 116 (see FIG. 9 for more details) can include one or more input mechanisms, such as one or more buttons, that allow a user to initiate a movement of the probe holder 124 and/or the DUT holder 120 relative to one another. For instance, a weld check station can include a button or input mechanism that when activated, brings the probes on the probe holder 124 into contact with the DUT 122 proximate to its weld joints. When the button is activated while the probes are in contact with the DUT, the probes can be moved away from the DUT 122.

One or more sensors can be coupled to the probe holder 124 that allow a position of the probe holder and its one or more probes to be determined. The sensor data can be processed by the probe holder control 106. In one embodiment, a camera can be attached to the probe holder 124. Image data received from the camera can be used, such as by the probe holder control 106, to determine whether the probe 126 is correctly positioned. For instance, the probe holder control 106 can be configured to recognize one or more features of the DUT 122 and/or the DUT holder 120 using a machine vision system and based upon the recognized features determine whether the probes and/or the DUT 122 are correctly positioned.

The VNA control 110 can be used to send commands to the VNA 114 to generate particular signals. For instance, in one embodiment, after the system controller 102, determines one or more probes, such as 126a and 126b, are in place, the VNA control can direct the VNA 114 to generate a calibration signal. Then, after the system controller 102 determines the probe is properly positioned an calibrated, the VNA control portion of the system controller 102 can direct the VNA 114 to generate a test signal and then measure a response signal where the test and response signals are output and input via the one or more probes, such as 126a and 126b.

In one embodiment, the test signal can include a sweep through a frequency range where a number of test signals are generated and a response is measured. For example, when time domain reflectometry (TDR) or swept frequency impedance is used, 100-200 test signals can be generated within a frequency range and a response measured to each of the test signals. However, it is also possible to use as little as a single frequency. For a frequency sweep, the test signals can be generated in a serial manner. Examples of measurements from a frequency sweep in a TDR analysis are discussed with respect to FIG. 10.

When a DUT, such as 122, includes multiple weld joints that are tested, in one embodiment, the weld joints can be tested in a serial manner. For instance, one or more test signals can be generated and response signals can be measured via probe 126a at weld check location 130. Then after testing is complete, one or more test signals can be generated and response signals can be measured via probe 126b at weld check location 134.

In other embodiments, different weld joints can be tested simultaneously. For example, weld joints at 130 and 134 can be tested at the same time. To avoid interference, the frequencies of the test signals could be off-set or shifted. For instance, one weld joint could be tested in a frequency sweep that proceeded from low frequencies to high frequencies while the other weld joint could be tested in a frequency sweep that proceeded from high frequencies to low frequencies. In another example, the test frequencies used at a third weld joint could be shifted by some amount from the test frequencies used at a second weld joint which could be shifted by some amount from the test frequencies used at a first weld joint. The shift amount can be selected to avoid or minimize test signal and response signal interference.

The weld assessor 108 can receive information characterizing the test and response signals from the VNA 114. The information characterizing test and response signals can be used to characterize a quality of weld that is being tested. In one embodiment, the signal database 107 can include baseline information characterizing one or more signals that are associated a "good" quality weld. The information characterizing the baseline signals associated with the "good" quality weld can be compared to the information characterizing the test and response signals generated from testing the DUT 122 to determine whether the weld or welds on DUT 122 are also of good quality.

One or more parameters can be defined that are utilized in the comparison. For instance, the difference in a magnitude between the current weld test signals and the baseline signals can be defined such that when the difference is above a certain value the weld is identified as either needing additional testing or is unacceptable and when the difference is below a certain value the weld is identified as being acceptable. Similarly, the difference in a phase between the current weld test signals and the baseline signals can be defined such that when the difference is above a certain value the weld is identified as either needing additional testing or is unacceptable and when the difference is below a certain value the weld is identified as being acceptable.

A signal database, such as 107, can be populated before testing of the DUT 122 is performed. Measurements can be performed on a number of welds using the VNA 114 in a similar configuration as is to be used under general testing conditions. During the signal database 107 generation phase, the tested items can be subject to additional tests. For instance, an item tested using the VNA 114 can be subject to a mechanical stress test, visual inspection and other destructive or non-destructive tests to determine whether the weld was of good quality. When it is determined that a weld was of a good quality, the information characterizing the weld generated using the VNA 114 can be added to the signal database 107.

In one embodiment, the baseline signal information can be an average baseline determined from the testing of a number of different welds determined to be of good quality. This testing methodology can also be used to determine signal margins used to assess whether a weld is of good quality or not. For instance, VNA related information generated from testing welds that fail under a mechanical test can be compared to information generated from testing welds that do not fail to determine an allowable variation from the baseline test signals. Further details of a developing and implementing a weld check criteria are described with respect to FIGS. 11-13.

The user interface 112 can be used to output weld test results to a user. For instance, the user interface 112 can be used to output VNA information associated with the weld test for DUT 122 and baseline VNA information. Further, the user interface can be used to output information indicating whether the weld that is currently being tested is of an acceptable quality.

FIG. 5 shows a side view of an embodiment of a probe 124 coupled to a vector network analyzer for assessing a quality of a weld joint. A probe 126 and cable 140 are secured by a probe holder 124. As shown in FIGS. 8 and 9, the probe holder can be secured to a fixture which is part of a weld check station.

The cable 140 is communicatively coupled to a vector network analyzer (VNA). The VNA can be used to generate a test signal which is sent to the probe and the signal pin 152. The signal emitted from the signal pin 152 can travel through component 148a, weld 142 and component 148b via signal path 144. The transmitted signal can be detected at the ground pin 156 and transmitted back through the probe to the VNA for signal processing.

The weld joint can be a single point or multipoint weld. The two components, such as 148a and 148b, can be part of a system associated with the portable computing device, such as an antenna system. In particular embodiments, the probes can be a high-speed TDR probes that transform a coax cable to a signal/ground pair, or a custom-routed printed circuit board (PCB) that uses a pogo pin or other compliant connectors.

In particular embodiments, the VNA can be used to measure S-parameters, such as S11, S21, S12 and S22, associated with the weld joint. In one embodiment, an S11 measurement, which is equivalent to the impedance of the DUT, can be performed to assess the quality of the weld joint. The S11 measurement can be generated as part of the TDR analysis previously described. In other embodiments, S21, S12 and S22 measurement can also be performed alone, in combination with the S11 measurement or in combination with each other to assess the quality of the weld joint.

FIGS. 6 and 7 are a top view of embodiments of pin locations, 168 and 170, for a probe used to measure characteristics of a multi-point weld joint 160 between two components, 164 and 166. For the DUT, the weld joint 160 includes 3 weld points, 182a, 182b and 182c. For weld points, 182a and 182c, successful weld columns are formed. However, for weld point 182b, a weld column is not successfully formed. In various embodiments, a VNA coupled to a probe can be used to check the quality of the weld joint 160. In particular, a TDR or SFI analysis applied to the weld joint 160 may be able to identify that the weld column associated with weld point 182b has not been successfully formed.

A weld column can be form such that it includes a pinched or necked region. When the pinched or necked region is to narrow, the weld column can be more prone to mechanical failure than a fully formed weld column. In the embodiments described herein, a TDR or SFI analysis can be configured to distinguish between a fully formed weld column and a weld column that is partially formed or defective in some manner.

To perform a TDR or SFI analysis, pins of a probe coupled to a VNA can be placed in area proximate to the weld joint 160. For instance, a signal pin of the probe can be placed within the signal pin target on component 168 and a ground pin of the probe can be placed within the ground pin target location 170 on component 164. In one embodiment, a probe can include multiple ground pins. The locations of the signal and ground pin targets can also be reversed such that the signal pin target is located on component 164 and the ground pin target is located on component 166.

It can be desirable to place the probe pins at the same location relative to the weld joint each time a weld joint is tested. Some margin of error can be afforded in regards to the pin placement. For instance, in one embodiment, the desired location for the pin placements can be within circles of 1 mm diameter or less. As is described in more detail with respect to FIG. 8A-8D, various mechanisms can be used accurately align a probe to a weld joint of a DUT.

In FIG. 6, a line 162 is drawn through the weld points 182a, 182b and 182c. The signal pin target and the ground pin target are orientated such that a line drawn through the target locations is perpendicular to line 162. The signal and target pin locations are not limited to this orientation. In general, the signal and ground pins can be placed on each of the components connected by the weld joint in any orientation proximate to the weld joint. The placement can depend on whether the joint is encased by material as well as space limitations associated with the DUT. Also, the weld points are not necessarily arranged in a line as shown in FIG. 6. As an example, in FIG. 7, the signal pin target 168 and the ground pin target are shown on the same side of line 162 through the weld points 182a, 182b and 182c.

FIG. 8A is a perspective view of an embodiment of a probe holder 124 including 1) alignment pins, 192a, 192b and 192c, for aligning the probe holder 124 to the DUT holder 120 and 2) probes 126a and 126b. The DUT holder 120 can include a depression, such as tub 196, in which a DUT can be placed. One or more pushers, such as 190a, 190b and 190c, which can be spring loaded devices can be coupled to the DUT holder 120. The pushers can be used to hold and also move the DUT to a particular orientation, such as pushed into corner 194. When the DUT is moved to the same position each time, it allows the probes, 126a and 126b to be accurately aligned with the DUT.

The pushers can be configured with a range of motion to allow DUT's of various sizes to be accommodated. For instance, the pushers can be configured to allow movement outwards toward the edge of the DUT holder 120 over some range to accommodate a larger DUT while still holding it place and/or moving it toward some position, such as corner 194. Further, the pushers can be configure to allow movement inwards towards the center of the DUT holder 120 over some range to accommodate a smaller DUT while still holding it place and/or moving it towards some position, such as corner 194.

In one embodiment, pushers can be provided that generate a slight separating force on a weld joint. The separating force can be selected to be less than the mechanical force needed to break the joint. In some instances, the pushers can physically separate two conductive portions of an improperly formed weld joints so that a conductive path between the conductive portions is broken. When the conductive path is broken, the defective joint can be more easily identified by the VNA.

Various mechanisms can be used to make sure the probe holder 124 and hence its attached probes, such as 126a and 126b, are accurately aligned with the DUT (One, two, three, four or more probes can be coupled to the probe holder 124 and the example of two probes is provided for the purposes of illustration only.) In one embodiment, align pins, such as 192a, 192b and 192c, which are designed to fit in holes in the DUT holder 120, can be used to ensure the DUT holder 120 and the probe holder are aligned. One or more alignment pins can be utilized and the example of three pins is provided for illustrative purposes only. Further, the location of the alignment pins is not limited to the outer edge of the DUT holder 120. For instance, an alignment pin can be configured to fit in a hole in the tub region of the DUT holder 120.

In addition, alignment pins can also be placed on the DUT holder 120 that are configured to fit in holes on the probe holder 124. In one embodiment, alignment pins can be located on the DUT holder 120 instead of the probe holder 124. In other embodiments, alignment pins can be both located on the DUT holder 120 and the probe holder 124 and each of the probe holder 124 and the DUT 120 can include holds for receiving respective alignment pins.

In one embodiment, the probe holder can include multiple probe slots that allow probes to be added and removed in a modular manner. This function can allow different probe configurations to be generated at the weld test station without having to change the probe holder. The probe slots can be configured to allow an orientation of the probes to be adjusted and then locked into places. For instance, the probe slots can include a track along which a position of an inserted probe can be adjusted before it is locked into place.

Figure 8B:
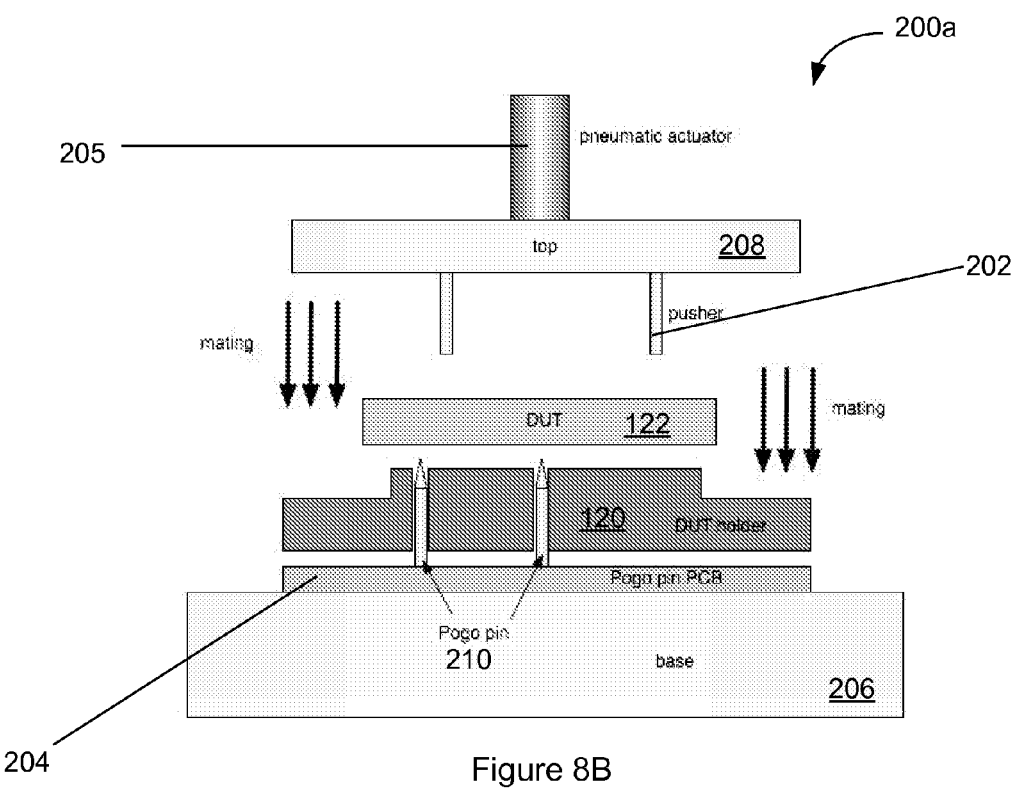
FIGS. 8B-8D are side views of embodiments of fixture assemblies that can be used in a weld check station.
Figure 8C:
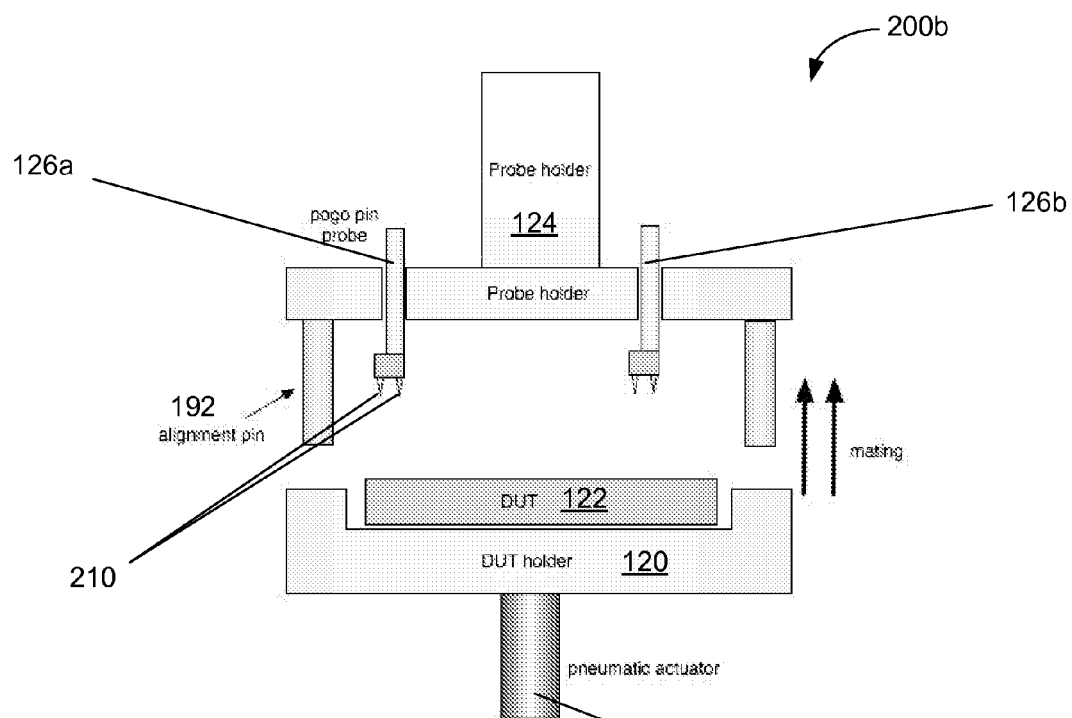
Figure 8D:
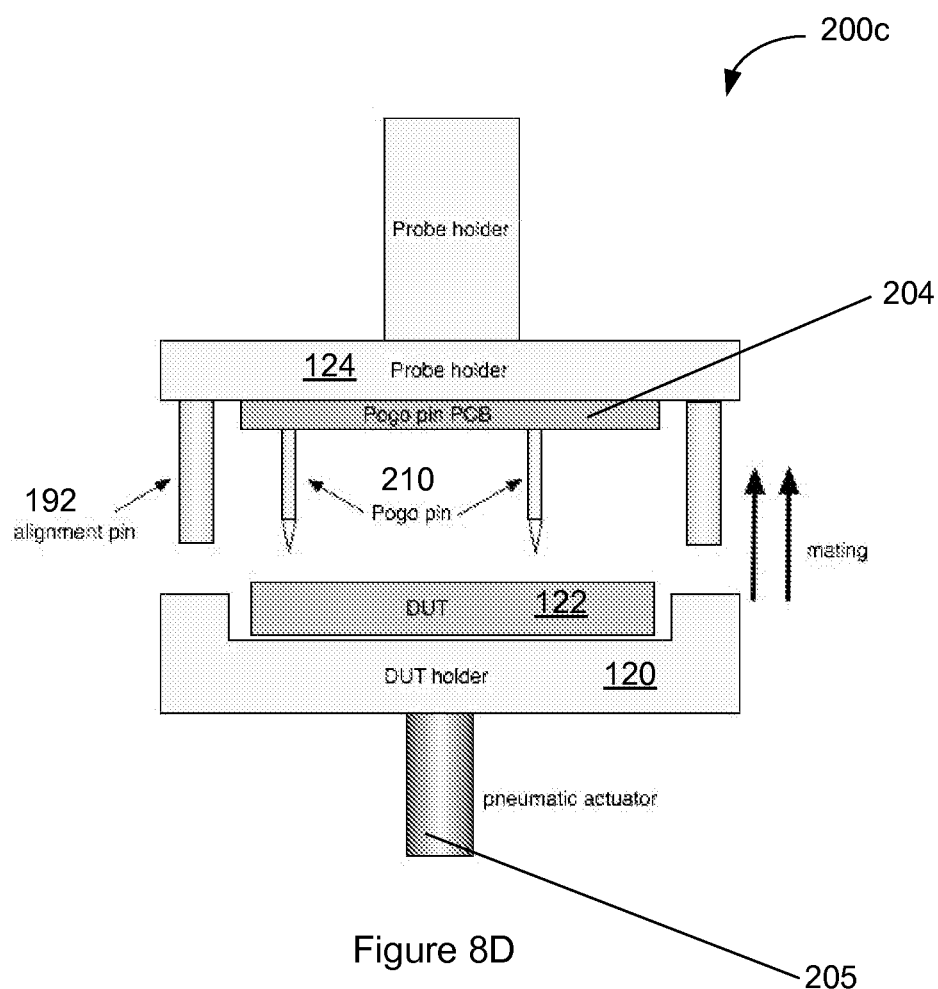

FIG. 8B-8D are side views of embodiments of fixture assemblies, such as 200a, 200b and 200c, that can be used in a weld check station. With respect to FIG. 8B, a fixture assembly 200a that includes a printed circuit board (PCB) 204 with two pogo pins mounted to a base 206 is described. The PCB 204 and its associated pins can be coupled to a VNA, as previously described. The pins can be used to deliver test signal generated by the VNA and receive a test signal from the VNA. A DUT holder 120 is mounted over the PCB 204. The DUT holder 120 includes apertures that allow the pogo pins to protrude through and extend above an upper surface of the DUT holder 120.

A top portion 208 of the fixture assembly 200a includes pushers, such as 202, for aligning the DUT 122 in the DUT holder 120. The top portion 208 is coupled to an actuator, such as a pneumatic actuator. The actuator 205 can raise or lower the top portion. During operation, the top portion 208 is configured to move downwards and push the DUT 122 into position in the DUT holder 120 such that the pogo pins can be brought into contact with the components of a weld joint.

The pogo pins can move inwards in response to be being brought into contact of the weld joints. For instance, the pogo pins can be coupled to springs which allow the pins to move inward in response to being placed in contact with a surface and then return to their original height when removed from the surface. The amount each pogo pin moves inward can vary to allow the pogo pins to each conform to surfaces of different heights. When properly aligned, the pogo pins can be used to assess a quality of the weld joint, such as via a TDR or a SFI measurement.

With respect to FIG. 8C, a fixture assembly 200b that includes a probe holder 124 with two pogo pin probes, such as 126a and 126b is described. The probes can be coupled to coaxial cables that can be coupled to the VNA. The probe holder 124 can be configured to mate with the DUT holder 120. The probe holder 124 can be configured in a fixed position while the DUT holder 120 can be raised or lowered via an actuator, such as a pneumatic actuator 205. When the DUT 122 is raised, the alignment pins coupled to the probe holder 192 can interface with apertures on the DUT holder to help align the probes to the DUT. Then, the pogo pins on each of the probes, 126a and 126b, can be brought into contact with components of a weld joint. When properly aligned, the pogo pins can be used to assess a quality of the weld joint, such as via a TDR or SFI measurement.

With respect to FIG. 8D, a fixture assembly 200c that includes a printed circuit board (PCB) 204 with two pogo pins mounted to a probe holder 124 is described. A DUT holder 120 that holds the DUT 122 is mounted to an actuator, such as pneumatic actuator 205. The pneumatic actuator can be used to raise and lower the DUT 122 and DUT holder 120 such that the DUT 122 is brought into contact with the pogo pins proximate to a weld joint. Then, a quality of a weld joint can be assessed via measurements performed using the pogo pins and a VNA coupled to the pogo pins.

FIG. 9 is a perspective view of an embodiment of a weld check station. The weld test station includes 1) a cable 140 that can couple probe 126 to a VNA 114, 2) a probe holder 124 for holding the probe 126, 3) a DUT holder 120 for positioning the device that is being tested. The probe holder 124 can be a holder for a coax cable adapters or a custom routed PCB. As described above with respect to FIGS. 8A-8D, other configurations of fixture assemblies that include probes, a DUT holder and mechanisms for aligning a DUT with the probes are possible and the example in FIG. 9 is provided for the purposes of illustration only.

The probe holder 124, probe 126 and DUT holder 120 can be coupled to a structure to form fixture 116. An absorber 190 can be provided with the fixture to isolate the fixture 116 from stray signals, such as stray radio signals. The stray radio signals can be generated from other weld check stations and/or sources that can be present in the test environment.

In particular embodiments, the fixture 116 can be configured to allow a range of motion to be provided to probe holder 124 and its associated probe 126 relative to a DUT (not shown). For instance, the fixture 116 can be configured to allow a distance between the DUT holder 120 and the probe 126 to be adjusted such that the probe 126 can be moved toward or away from the DUT (vertical position change). The probe 126 can be moved toward or away from the DUT by moving the DUT holder 120, the probe holder 124 or combinations thereof. In one embodiment, the fixture 116 can also be configured to provide a horizontal position change between the probe 126 and the DUT holder 120. In particular embodiments, one or more motors can be provided with the fixture to aid in a positional change.

In yet other embodiments, the DUT does not have to be secured in a horizontal position in the DUT holder 120. For instance, the DUT can be secured in a vertical position or an angle position in the DUT holder 120. The probes and the probe holder 124 can be adjusted depending on the orientation of the DUT in the DUT holder 120.

In operation, a DUT can be placed in the DUT holder 120 and then the DUT and the DUT holder 120 are raised towards the probe holder 124. At a check position, pins of the probes associated with the probe holder 124 can be brought into contact with the DUT proximate to weld joints that are to be checked. Then, using the VNA and the probes, a quality of the weld can be assessed by performing a TDR or SFI measurement and analysis.

FIG. 10 is a graph of phase versus frequency for a number of time domain reflectometry measurements. A phase versus frequency measurement of a weld joint is shown for a weld joint on three different devices. One curve 202 is for a "gold unit." As previously described, a gold unit can include a device with a weld joint that meets quality requirements. The curve 202 can be generated by performing a measurement using the VNA, such as TDR measurement, on the weld joint of the gold unit. Although shown as a solid line, the curve 202 can include a number of discrete points corresponding to frequencies where a measurement is made.

The curve 204 can be from a weld joint of a DUT checked at the weld check station, such as weld check station shown in FIG. 9. The curve 204 can be generated by repeating the TDR measurement that was previously performed on the gold unit. The curve 206 can be from a weld joint of an "anti-gold" unit checked at a weld check station. An anti-gold unit can be a device including a weld joint that does not satisfy weld quality requirements, such as a weld joint where one or more of the weld columns are broken or not properly formed.

The sensitivity of a TDR measurement to weld imperfections in a weld joint, such as broken columns, can vary from frequency to frequency. For example, over frequency ranges 208 and 210, a large difference is shown in the phase response between the gold unit and the anti-gold unit. However, between the frequency ranges, 208 and 210 and above frequency range 210, there is less difference in the phase response between the gold unit 202, the anti-gold unit 206 and the DUT 204.

The difference in sensitivity as a function of frequency of the measurements performed on the gold unit and anti-gold unit can be used to select frequencies to utilize in the TDR analysis. The selection can be based upon a comparison between gold unit and anti-gold unit measurements where more frequency points can be selected in frequency ranges where the measurements are most sensitive. For instance, using a VNA, measurements can be performed at about 200 different frequencies, as part of a frequency sweep (More or less frequencies can also be employed, such as frequency sweep of about 100 different frequencies). In yet other embodiments, it may be possible to determine a defective weld joint by performing a measurement at a single frequency. In one embodiment, the spacing between the frequencies can be non-uniform and individual frequencies can be selected. Thus, after comparing gold unit and anti-gold unit measurements, it can be decided to select more frequency points to utilize within ranges 208 and 210 where the differences between the gold unit and anti-gold unit measurements are more pronounced, and less frequency points between range 208 and 210 and above 210 where the differences between the gold unit and anti-gold unit measurements are less pronounced.

In another embodiment, the spacing between the frequencies that are utilized can be uniform. In this instance, after comparing gold unit and anti-gold unit measurements, it can be decided to ignore some frequencies where the differences between the gold unit and anti-gold unit measurements less pronounced such as between frequency ranges 206 and 210 and above frequency range 210. Within ranges 206 and 210, where the measurements are more sensitive, it can be decided to use all of the frequency points or perhaps to cull fewer points as compared to the less sensitive areas, such as between frequency ranges 206 and 210.

After the frequency points to use in a quality assessment of a weld are selected, error bars or ranges can be selected, such as 212a, 212b and 212c, at each frequency. The error bars can be centered on a gold unit curve, such as 202. When a measurement is performed on a weld joint of a DUT, it can be compared with the measurement of the gold unit at each frequency. In one embodiment, when the DUT frequency measurements are within the selected error bars at each frequency, then the weld joint on the DUT can be accepted. When the DUT frequency measurements are outside the error bars at one or more different frequencies, the DUT can be rejected or can be designated for more testing. As is described with respect to FIG. 11, the selection of the error bars and the criteria for accepting and rejecting units can be part of pass-fail criteria for the DUT weld joint testing.

In particular embodiments, a width of the error bars can vary from frequency to frequency. For instance, an error bar at a first frequency can be greater or less than an error bar at a second frequency. In addition, the error bar does not have to be the same above and below the gold line curve. For instance, the error bar can be wider above the curve than below the curve or vice versa.

In yet another embodiment, rather than performing a relative comparison where a DUT is compared to a gold unit, a comparison can be made against a fixed set of values. For instance, fixed upper and lower values can be determined for the phase values as a function of frequency. Then, a DUT can be tested to determine whether the measurement falls within the fixed upper and lower values. If the DUT is outside the fixed upper and lower values, then the DUT may be rejected.

Figure 11:
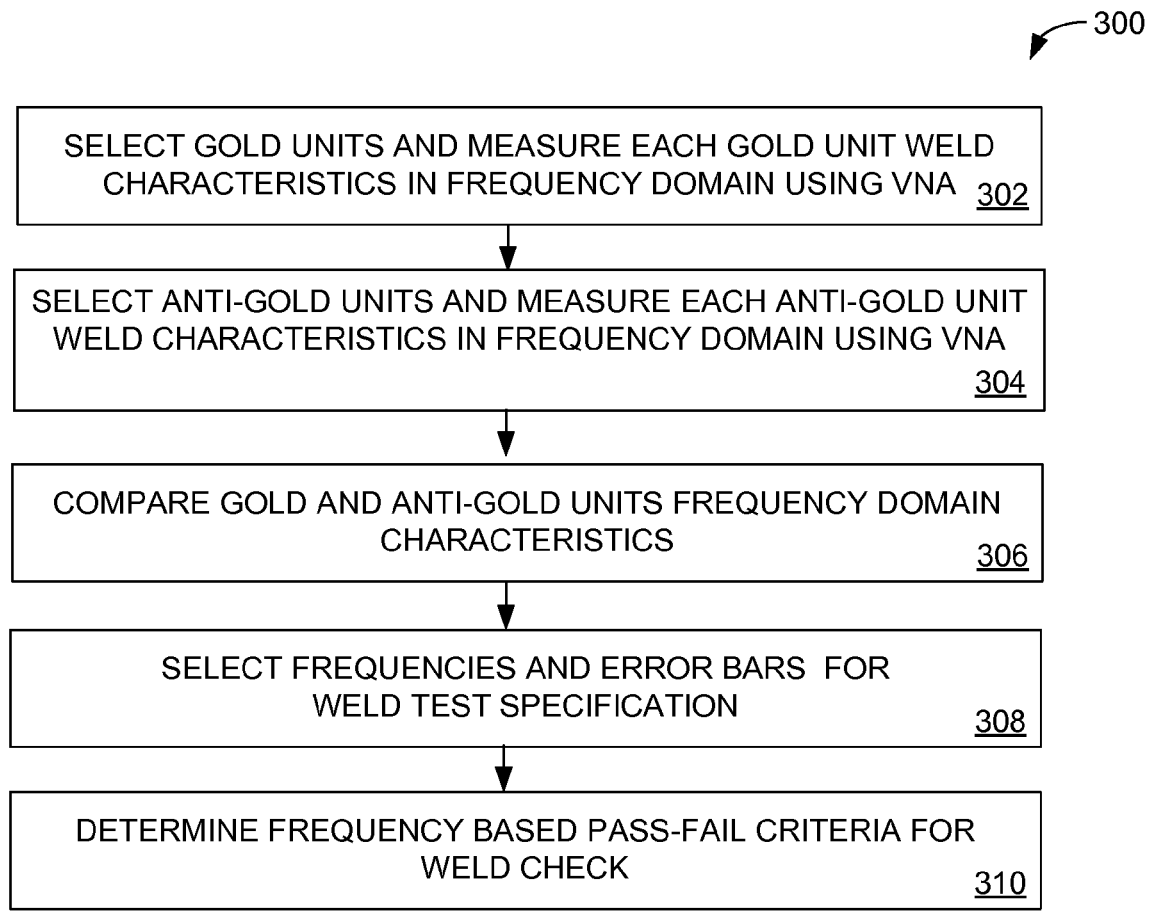
FIG. 11 is flow chart of an embodiment of a method of determining pass-fail criteria for a weld check.

FIG. 11 is flow chart of an embodiment of a method 300 of determining pass-fail criteria for a weld check. In 302, gold units each with one or more weld joints determined to meet weld quality specifications can be selected. In one embodiment, additional tests can be performed, such as mechanical tests, visual tests and other non-destructive tests can be performed to determine whether a weld joint meets gold unit qualifications. After the gold units are selected, weld joint characteristics can be measured using a VNA. For example, the VNA can be used to perform a TDR analysis on the gold unit.

In 304, anti-gold units with imperfect weld joints can be selected. For instance, a weld joint on an anti-gold unit can have weld columns that are all broken or improperly formed. In another example, the anti-gold unit can include multiple weld columns where only a portion of the weld columns are improperly formed. After the anti-gold units are selected, the weld joint characteristics can be measured using the VNA, such as the same type of measurement performed on the gold units. In 306, the gold unit and anti-gold measurements can be compared (e.g., see FIG. 10). In one embodiment, a TDR analysis can be performed on both gold and anti-gold units and the measurements can be compared on a frequency by frequency basis over some range of frequencies.

In 308, frequencies and error bars at each frequency can be selected. In one embodiment, tests on a number of gold units can be performed. The measurements can vary from gold unit to gold unit. An amount of variance between the measurements on the different gold units can be used to generate appropriate error bars. Further, multiple measurement can be performed on a single gold unit. The measurements on the single unit can vary from measurement to measurement. An amount variance between the measurements on the single gold unit can also be used to generate appropriate error bars.

In 310, based on the selected frequencies and their associated error bars, pass-fail criteria can be developed for the weld check of the weld joint. For instance, the pass criteria for each weld joint on a DUT can be that the measurements performed on the DUT are all within the error bars. The fail criteria can be that if one or more measurements performed on each weld joint of the DUT are outside the error bar the DUT is rejected. In another example, after initially failing, a DUT can be set aside for additional testing. If the DUT passes the additional testing, then the DUT can be passed.

In particular embodiments, a DUT can include multiple weld joints that are tested. The method of determining frequencies and error bars for pass-fail criteria can be repeated for each weld joint that is tested. The frequencies and error bars that are selected and an associated pass-fail criteria can vary from weld joint to weld joint that is tested on the DUT. An overall pass-fail criteria for the DUT can involve pass-fail criteria from multiple weld joints. For instance, for a DUT to be accepted that includes multiple weld joints, the pass-fail criteria for each of the weld joints may have to be met.

Figure 12:
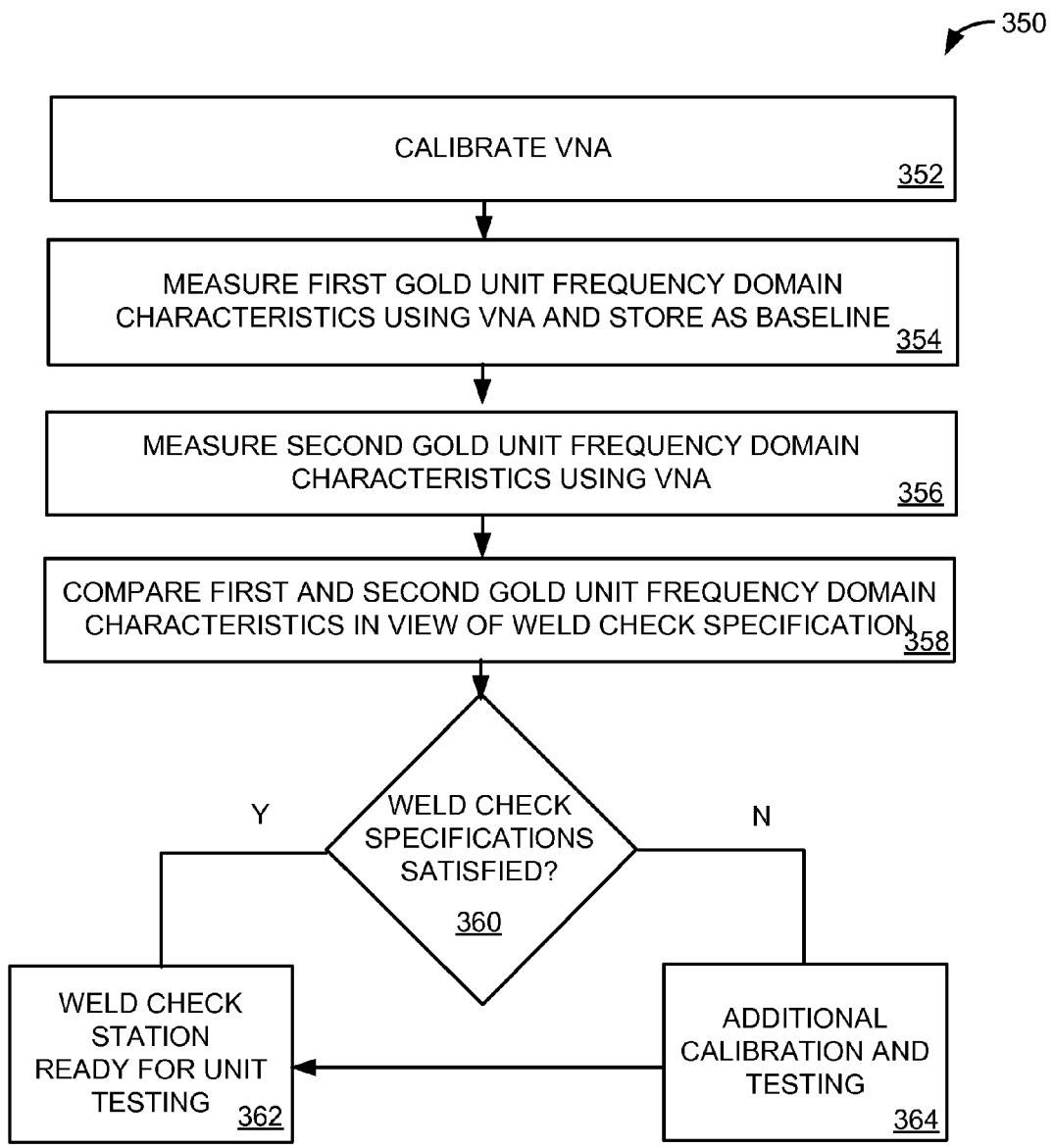
FIG. 12 is a flow chart of an embodiment of a method for calibrating a weld check station.

FIG. 12 is a flow chart of an embodiment of a method 350 for calibrating a weld check station. In 352, the VNA can be calibrated. The VNA can be calibrated at some frequency interval such as once a day, once a week, after a certain number of hours of use, etc. In 354, a weld joint on a first gold unit can be checked at the weld check station. For instance, a TDR analysis using a VNA can be performed on the first gold unit. The TDR analysis for the first gold unit can be stored as a baseline. For instance, the TDR analysis can result in data that allows a gold unit curve like the one shown in FIG. 10 to be generated. The check in 354 can be performed at particular intervals, such as once per manufacturing shift, once per time period or after a certain number of checks of devices at the weld check station, such once each time 1000 units are checked.

In 356, a TDR analysis can be performed on a second gold unit. In 358, the data generated from the first and second gold unit measurements can be compared to one another in view of a weld check specification. The weld check specification can include error bars that are placed around the first gold unit measurement at each frequency. In one embodiment, second gold unit measurement is compared to the first gold unit measurement to determine whether the second gold unit measurement falls within the error bars.

In one embodiment, the calibration error bars can be different than the error bars used during device testing. For instance, the error bars used in the calibration process can be smaller than the error bars used for general device testing because during calibration a first gold unit is being compared to a second gold unit. In other embodiments, the same standard is used for both calibration and general testing at the weld check station.

In 360, it can be determined whether the weld check specifications are satisfied. In 362, when the weld check specifications are satisfied based upon the comparison between the first gold unit and the second gold unit measurements, the weld check station can be designated as ready for general unit testing. In 364, when the weld check specifications are not satisfied addition calibration and testing can be performed until 362 is reached.

In one embodiment, multiple gold units can be compared to one another as part of the calibration process. In another embodiment, one or more anti-gold units can be checked in the calibration process. The anti-gold units can be checked to ensure that these units are rejected.

Figure 13:
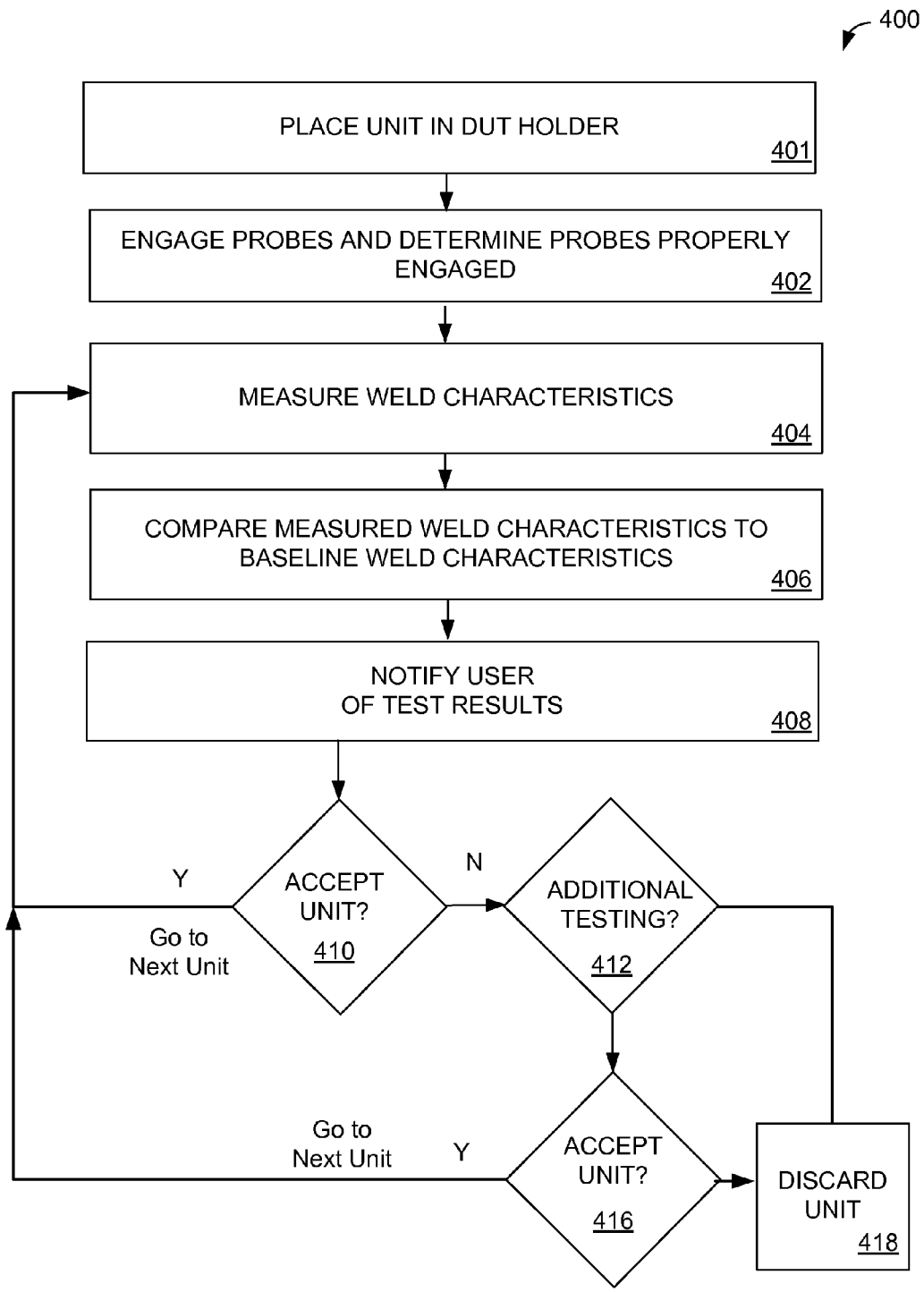
FIG. 13 is a flow chart of an embodiment of method of characterizing a weld joint used in a portable computing device at a weld check station.

FIG. 13 is a flow chart of an embodiment of method 400 of characterizing a weld used in a portable computing device. In 401, a DUT can be placed in a DUT holder that is part of a weld check station fixture assembly. In 402, the fixture assembly can be actuated such that pins used to perform a measurement are engaged proximate to a weld joint on the DUT. Checks can be performed to determine that the pins are engaged at a correct position on the DUT. For instance, a camera and image recognition software can be used to determine that the pins are properly positioned.

In 404, a measurement, such as a TDR analysis can be performed on the DUT. For example, a VNA coupled to the pins can generate a test signal that is transmitted through the weld joint and a response signal that is returned to the VNA can be analyzed. In 406, the measured weld characteristics determined from the response signal returned to the VNA can be compared to the weld characteristics of a gold unit previously analyzed at the weld check station to determine in 408 whether to accept or reject the weld. The gold unit analysis can have been performed during the calibration process described with respect to FIG. 12.

In 410, a user can be optionally notified of whether the weld was accepted or rejected. When the unit is accepted, the unit can be removed from the weld check station and replaced with a new unit to be tested. In 412, a decision can be made to perform additional testing. If the weld is not retested, in 418, the unit can be discarded. If the weld is retested, in 416, a decision can be made whether to accept or reject the unit. If the unit is rejected, then in 418, the unit can be discarded or set aside for repair.

Different aspects, embodiments or implementations may yield one or more of the following advantages. The present invention provides a non-destructive method and apparatus for characterizing the quality of a weld between two components used in a portable computing device. The method and apparatus are suitable for use in a mass production environment. The method an apparatus can be used to characterize mechanical and/or electrical properties of the weld. Based upon the characterization, tested items can be accepted, rejected or retested. Many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A method of testing a portable computing device comprising:
   generating one of a time domain reflectometry (TDR) measurement or a swept frequency impedance measurement of a weld joint on a gold unit using a vector network analyzer (VNA);
   generating one of a TDR measurement or a swept frequency impedance measurement of a weld joint between two components of a device under test using a probe coupled to the vector network analyzer wherein the vector network analyzer sends a signal to the probe that is transmitted through the weld joint;
   comparing the TDR measurement of the weld joint on the gold unit to the TDR measurement of the weld joint on the device under test or the swept frequency impedance measurement on the gold unit to the swept frequency impedance measurement of the weld joint on the device under test; and
   based upon the comparison, accepting or rejecting the weld joint on the device under test.

2. The method of claim 1, wherein the weld joint is a multi-point weld.

3. The method of claim 2, wherein at least one weld point of the multi-point weld is acceptably formed and at least one weld point of the multi-point weld is unacceptably formed.

4. The method of claim 1, further comprising: positioning the probe proximate to the weld joint.

5. The method of claim 1, wherein the probe is one of a high-speed time domain reflectometer (TDR) probe including at least two pins or a custom-routed printed circuit board including the at least two pins.

6. The method of claim 4, wherein the pins are pogo pins.

7. A method of testing a portable computing device comprising:
   generating one of a time domain reflectometry (TDR) measurement or a swept frequency impedance measurement of a weld joint on a gold unit using a vector network analyzer (VNA) wherein the TDR measurements is performed at a plurality of different frequencies;
   generating one of a TDR measurement or a swept frequency impedance measurement of a weld joint between two components of a device under test using a probe coupled to the vector network analyzer wherein the vector network analyzer sends a signal to the probe that is transmitted through the weld joint at each of the plurality of different frequencies;
   comparing the TDR measurement of the weld joint on the gold unit to the TDR measurement of the weld joint on the device under test on a frequency by frequency basis or the swept frequency impedance measurement of the weld joint on the gold unit to the swept frequency impedance measurement of the weld joint on the device under test on a frequency by frequency basis; and
   based upon the comparison at each of the plurality of frequencies, accepting or rejecting the weld joint on the device under test.

8. The method of claim 7, wherein measurements are performed at one or more frequencies.

9. The method of claim 7, the plurality of different frequencies range between about 100 MHz and 100 GHz.

10. The method of claim 7, further comprising: generating separate TDR measurements for each of multiple weld joints on the device under test and comparing each of the separate TDR measurements to TDR measurements performed on comparable weld joints of the gold unit.

11. The method of claim 10, wherein the accepting or rejecting of the device under test is based upon, the comparing of the TDR measurements for each of the multiple weld joints.

12. A weld check station comprising:
   a vector network analyzer (VNA);
   at least two pins coupled to the VNA;
   an assembly configured to 1) hold a device under test including at least one weld joint and 2) position a first pin on a first component of the weld joint and a second pin on a second component of the weld joint wherein the first component and the second component are joined via the weld joint; wherein the VNA is configured to send test signals and receives response from the at least two pins as part of one of a time domain reflectometry (TDR) measurement or a swept frequency impedance measurement generated for the weld joint; and
   a process and memory configured to receive data associated with the TDR measurement or the swept frequency impedance measurement and to determine whether the weld joint is acceptable based upon the TDR measurement or the swept frequency impedance measurement.

13. The weld check station of claim 12, wherein the first pin is positioned on a first surface of the first component and the second pin is positioned on a second surface of the second component wherein the first surface and the second surface are at different heights.

14. The weld check station of claim 12, wherein the at least two pins are height-adjustable pogo pins.

15. The weld check station of claim 12, wherein the assembly is configured to simultaneously position pins proximate to each of multiple different weld joints.

16. The weld check station of claim 12, further comprising: a storage device for storing a TDR measurement of a weld joint or a swept frequency impedance measurement on a gold unit wherein the TDR measurement generated on the weld joint is compared to the TDR measurement of the weld joint on the gold unit or the swept frequency impedance measurement generated on the weld joint is compared to the swept frequency impedance measurement of the weld joint on the gold unit to determine whether the weld joint is acceptable.

17. The weld check station of claim 12, wherein the at least two pins are coupled to a printed circuit board.

18. The weld check station of claim 12, wherein the at least two pins are coupled to a TDR probe.

19. A method of calibrating a weld check station including a vector network analyzer comprising:
   generating one of a time domain reflectometry (TDR) measurement or a swept frequency impedance measurement of a weld joint on a first gold unit using the vector network analyzer;
   generating one of a time domain reflectometry (TDR) measurement or a swept frequency impedance measurement of a weld joint on a second gold unit using the vector network analyzer;
   comparing the TDR measurement of the weld joint on the first gold unit to the TDR measurement of the weld joint on the second gold unit or the swept frequency impedance measurement of the weld joint on the first gold unit to the swept frequency impedance measurement of the weld joint on the second gold unit on a frequency by frequency basis;
   based upon said comparison, determining whether the weld joint on the second gold unit meets a pass-fail criteria for the weld joint; and
   when the second gold unit meets the pass criteria, indicating the weld check station is calibrated.

20. The method of claim 19, further comprising:
   after the weld check station calibrated, generating one of a TDR measurement or a swept frequency impedance measurement of a weld joint on a device under test using the vector network analyzer; and
   comparing the TDR measurement of the weld joint on the first gold unit to the TDR measurement of the weld joint on the device under test or the swept frequency impedance measurement of the weld joint on the first gold unit to the swept frequency impedance measurement of the weld joint on the device under test on a frequency by frequency basis to determine whether the weld joint on the device under test is acceptable.

21. The method of claim 19, TDR measurement is generated for frequencies between 100 MHz and 100 GHz.

22. The method of claim 19, wherein a custom designed probe is used to perform the TDR measurement or the swept frequency measurement.

23. The method of claim 22, wherein one or more pins on the custom designed probe are curved.

24. A non-transitory computer readable medium for storing computer code executed by a processor in a computer aided manufacturing process comprising:
   computer code for generating one of a time domain reflectometry (TDR) measurement or a swept frequency impedance measurement of a weld joint on a gold unit using a vector network analyzer (VNA);
   computer code for generating one of a TDR measurement or a swept frequency impedance measurement of a weld joint between two components of a device under test using a probe coupled to the vector network analyzer wherein the vector network analyzer sends a signal to the probe that is transmitted through the weld joint;
   computer code for comparing the TDR measurement of the weld joint on the gold unit to the TDR measurement of the weld joint on the device under test or the swept frequency impedance measurement on the gold unit to the swept frequency impedance measurement of the weld joint on the device under test; and
   computer code for, based upon the comparison, accepting or rejecting the weld joint on the device under test.

25. The computer readable medium of claim 24, further comprising:
   computer code for displaying information characterizing the TDR measurement or the swept frequency impedance measurement of the weld joint.

* * * * *